United States Patent
Nome et al.

(10) Patent No.: US 7,498,874 B1
(45) Date of Patent: Mar. 3, 2009

(54) GLITCH-FREE START-UP WITH A TRACKING PIN

(75) Inventors: Faruk J. Nome, Sunnyvale, CA (US); Jeff Lee Nilles, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 142 days.

(21) Appl. No.: 11/462,311

(22) Filed: Aug. 3, 2006

(51) Int. Cl.
*H03F 1/02* (2006.01)

(52) U.S. Cl. .......................... 330/9; 327/124

(58) Field of Classification Search ............. 330/9; 327/124, 307
See application file for complete search history.

(56) References Cited

U.S. PATENT DOCUMENTS

| | | | |
|---|---|---|---|
| 6,046,577 A * | 4/2000 | Rincon-Mora et al. ...... | 323/282 |
| 6,201,375 B1 * | 3/2001 | Larson et al. ............... | 323/277 |
| 6,288,523 B2 | 9/2001 | Antoszkiewicz | |
| 6,727,748 B2 * | 4/2004 | Kuo ............................. | 330/9 |
| 6,836,095 B2 * | 12/2004 | Fogg .......................... | 320/128 |
| 6,962,436 B1 * | 11/2005 | Holloway et al. ........... | 374/170 |
| 6,977,976 B1 * | 12/2005 | Birkett et al. ............... | 375/345 |

OTHER PUBLICATIONS

Tucker, J., "Using the TPS54X80 Tracking Swift dc/dc Converters for Simultaneous Tracking of the Input Supply," Texas Instruments, pp. 1-6, Feb. 2005.
LTC3416, "4A, 4MHz, Monolithic Synchronous Step-Down Regulator with Tracking," Linear Technology Corporation, pp. 1-16, 2004.

* cited by examiner

*Primary Examiner*—Henry K Choe
(74) *Attorney, Agent, or Firm*—Darby & Darby P.C.; Matthew M. Gaffney

(57) ABSTRACT

An error amplifier for closed loop operation is provided. The error amplifier has a track input and a feedback input. During soft-start, a voltage offset is added to the error amplifier input. In one embodiment, the voltage offset is gradually removed during the soft-start.

20 Claims, 5 Drawing Sheets

GLITCH-FREE START-UP WITH A TRACKING PIN

FIELD OF THE INVENTION

The invention is related to error amplifiers, and in particular but not exclusively, to voltage regulator that adds an offset to the start-up to prevent a transient glitch from occurring.

BACKGROUND OF THE INVENTION

A switching regulator may be configured to provide an output voltage (Vout) in response to an input voltage (Vin). Typically, a switching regulator includes an inductor that is coupled to a switch. In operation, the inductor current is a triangle wave current based on the opening and closing of the switch, and an output capacitor provides Vout from the inductor current. Also, the switch is controlled by a control signal, where the duty cycle or the frequency of the control signal is typically modulated based on negative feedback.

Additionally, a diode-rectified switching regulator employs a diode to rectify the inductor current. A synchronous switching regulator employs a synchronous switch rather than a diode. In a synchronous switching regulator, the indicator current can be positive or negative. Additionally, other topologies may be employed, such as a SEPIC topology or a CUK topology.

BRIEF DESCRIPTION OF THE DRAWINGS

Non-limiting and non-exhaustive embodiments of the present invention are described with reference to the following drawings, in which.

DETAILED DESCRIPTION

Figure 1:
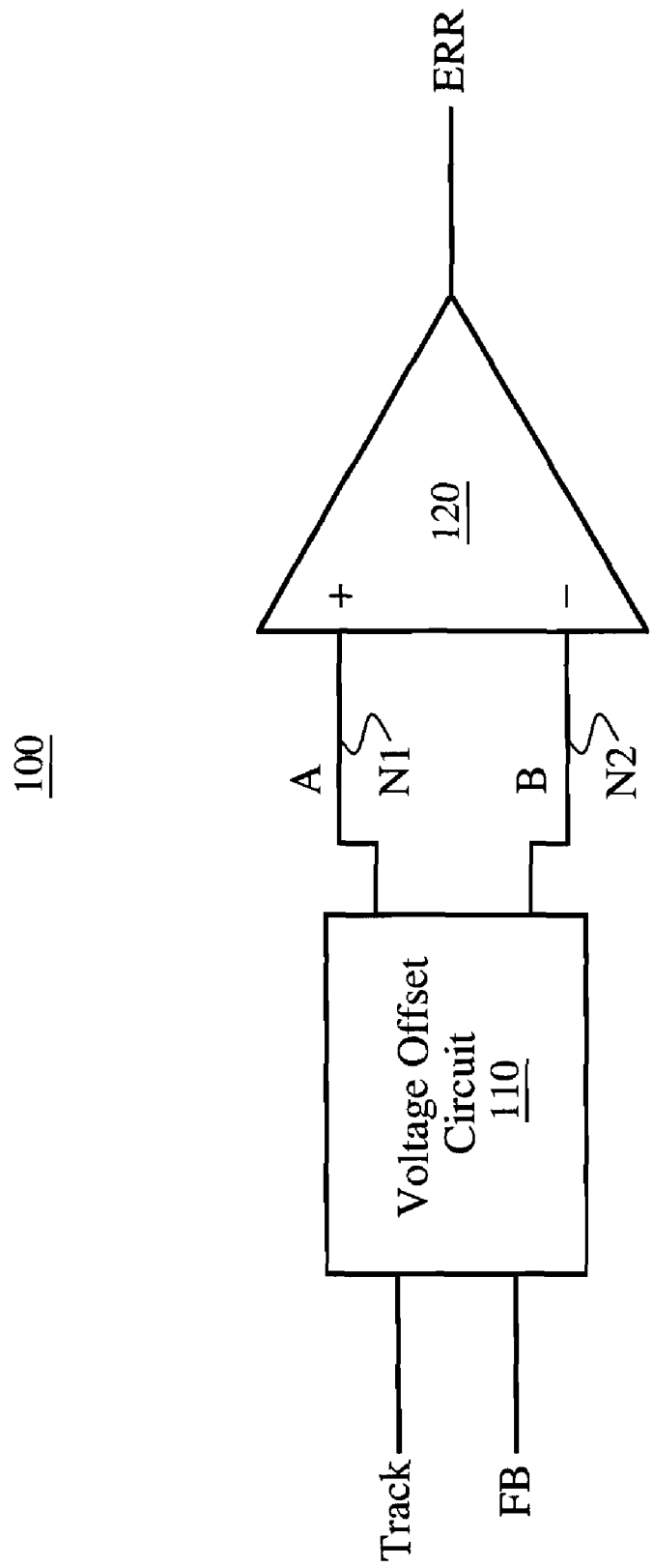
FIG. 1 shows a block diagram of an embodiment of an error amplifier and a voltage offset circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to an error amplifier for closed loop operation. The error amplifier has a track input and a feedback input. During soft-start, a voltage offset is added to the error amplifier input. In one embodiment, the voltage offset is gradually removed during the soft-start.

FIG. 1 shows a block diagram of an embodiment of circuit 100, which includes an embodiment of voltage offset circuit 110 and error amplifier 120. Error amplifier 120 has a first input coupled to node N1 and a second input coupled to node N2.

In one embodiment, voltage offset circuit 110 is operable to receive track signal Track and feedback signal FB, and to provide signals A and B to error amplifier 120. Error amplifier 120 is arranged to receive signals A and B at its inputs, and to provide error signal ERR.

In operation, signal FB is a feedback signal that is based, at least in part, on signal ERR due to the closed loop operation. Signal Track is used as a soft-start reference voltage during soft start.

Voltage offset circuit 110 is operable to provide a voltage offset to the input of error amplifier 120. In one embodiment, the voltage offset is pre-selected so that, in a worst-case scenario, the total offset for error amplifier 120 is greater than or equal to zero.

For example, in one embodiment, manufacturing variation may cause error amplifier 120 to have a voltage offset from −5 mV to +5 mV. In this embodiment, voltage offset circuit 110 provides a voltage offset of at least 5 mV. This ensures that the total voltage offset is at least 0 V.

If voltage offset circuit 110 were not present in circuit 100, the output of error amplifier 110 could be initialized high at start-up, thus causing a transient at the beginning of the soft-start. However, in one embodiment, voltage offset circuit 110 provides an offset to ensure that the output of error amplifier 110 is not initialized high, and accordingly achieve a glitch-free start-up.

At the start of soft-start, voltage offset circuit 110 provides a voltage offset. In one embodiment, the voltage offset is maintained through the operation of the circuit. In another embodiment, the voltage offset is maintained during soft-start, and the voltage offset is removed during normal operation. In one embodiment, the removal of the voltage offset is an abrupt transition. In another embodiment, the removal of the voltage offset is a gradual transition. Embodiments in which a gradual transition is used are preferred since this will prevent a transient at the transition point. However, the invention is not so limited, and an abrupt transition may be used in embodiments of the invention.

In one embodiment, a level-shifter may be used in front of the input to error amplifier 120. The level-shifter may have offset error due to manufacturing variations that are greater than typical offset error in the error amplifier itself. In this embodiment, voltage offset circuit 110 provides a voltage offset sufficient to ensure that the total voltage offset is at least zero. In one embodiment, the voltage offset circuit and the level-shifter are combined in the same part.

For example, in one embodiment, a level-shifter has a voltage offset that can vary from −20 mV to 20 mV from part to part, and the error amplifier has a voltage offset that can vary from −3 mV to 3 mV from part to part. In one embodiment, voltage offset circuit 110 provides a voltage offset of +30 mV to ensure that, in the worst-case scenario, signal ERR is not initialized high at start-up.

In one embodiment, signals A and B remain coupled to the input of error amplifier 120 during normal operation. In another embodiment, during normal operation, one input of error amplifier 120 is coupled directly to signal FB, and the other input is coupled directly to a fixed reference voltage.

In one embodiment, voltage offset circuit 110 provides a voltage offset to the input of error amplifier 110 at a start-up, and operates such that the voltage offset is absent during normal operation. The term "start-up" here may include both the initial start-up, and a re-start (e.g. after a fault condition). In one embodiment, soft-start is employed both during the initial start-up, and for a re-start.

Circuit 100 may be used in virtually any circuit that includes an error amplifier within a closed loop. For example, circuit 100 may be used in a PWM switching regulator. However, the invention is not so limited.

Although voltage offset circuit 110 is shown as receiving signals Track and FB, and providing signals A and B, in other embodiments, voltage offset circuit 110 only causes an offset in one of the two signals Track and FB, since adding a voltage offset to one of the two signals is sufficient to cause a voltage offset in the differential input to error amplifier 120.

Also, the reference to signal "Track" is non-limiting and any signal used as a reference during the soft-start may be used as signal Track.

Figure 2:
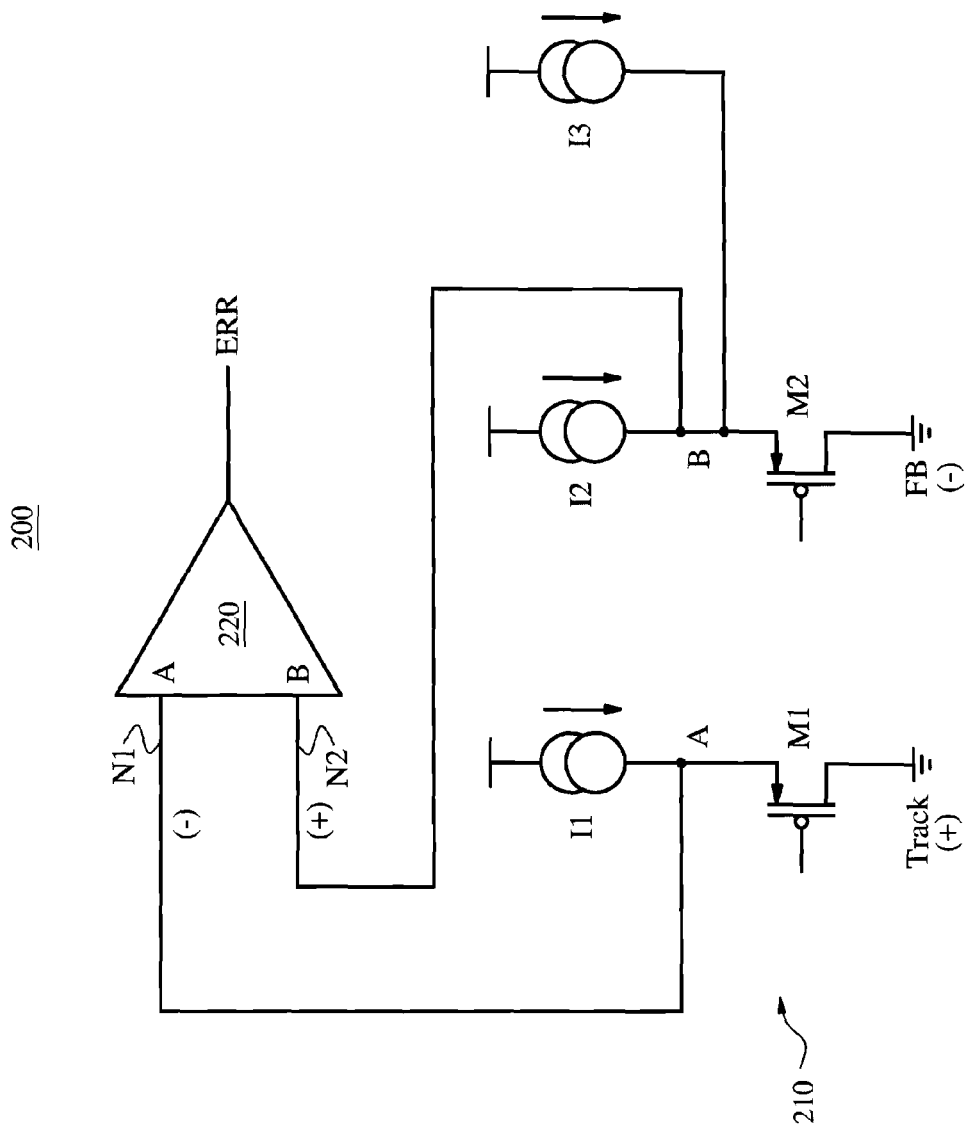
FIG. 2 illustrates a block diagram of an embodiment the error amplifier and voltage offset circuit of FIG. 1.

FIG. 2 illustrates a block diagram of circuit 200, which may be employed as an embodiment of circuit 100 of FIG. 1. Voltage offset circuit 210 includes current sources I1-I3 and transistors M1 and M2.

In one embodiment, current sources I1 and I2 from a 1:1 current mirror such that current I1 and I2 are substantially the same. However, current source I3 provides an additional current to the source of transistor M2, in order to cause the voltage offset at the input of error amplifier 220. For example, in one embodiment, I1 is 20 µA, I2 is 20 µA, and I3 is 5 µA. In one embodiment of circuit 200 as shown in FIG. 2, current I3 is provided throughout the operation of the circuit. However, in another embodiment, current I3 is provided at the beginning of soft-start, but is eventually removed so that the voltage offset is absent during normal operation, as illustrated in FIG. 3 in one embodiment.

Figure 3:
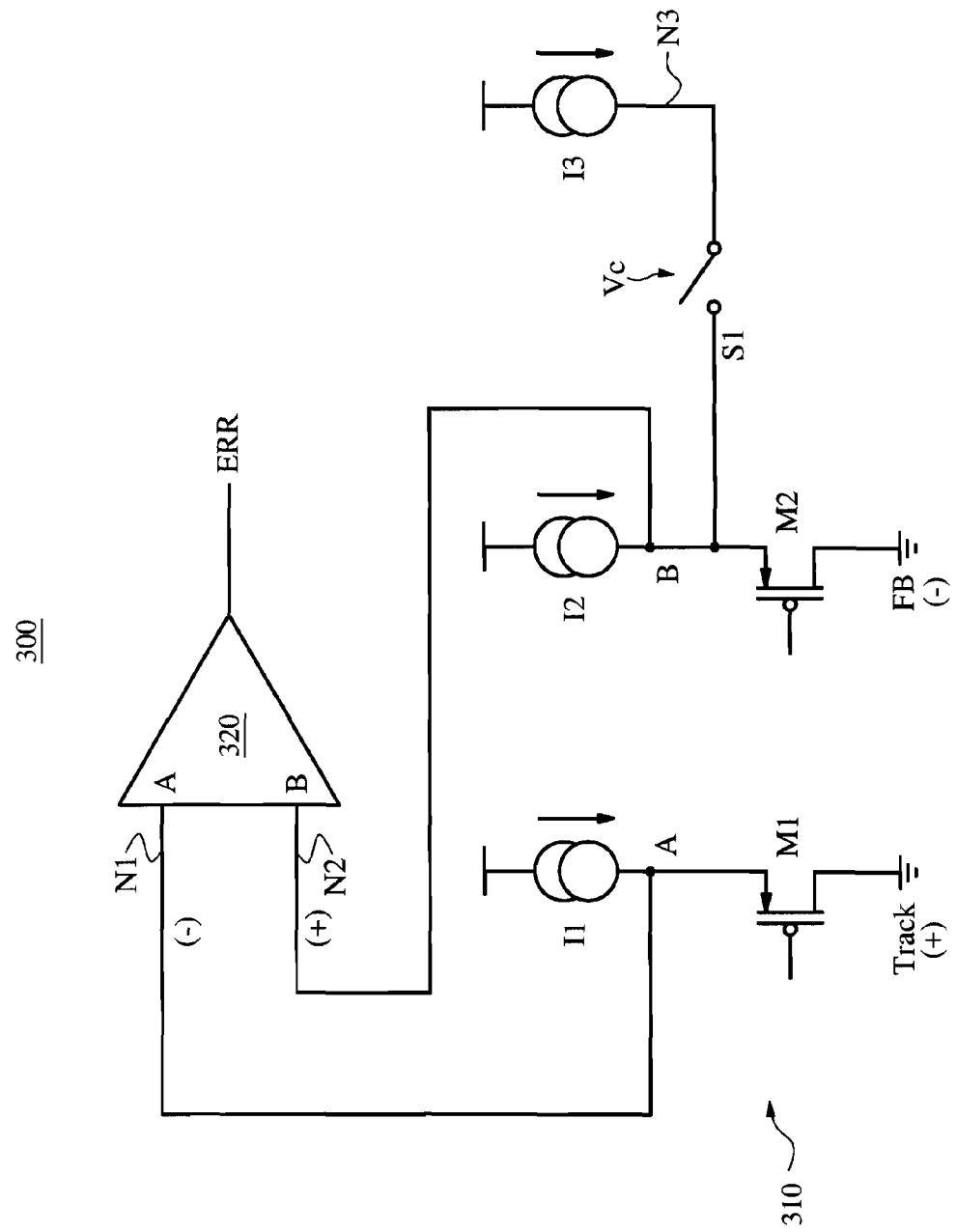
FIG. 3 shows a block diagram of another embodiment of the error amplifier and voltage offset circuit of FIG. 1.

FIG. 3 illustrates a block diagram of circuit 300, which may be employed as an embodiment of circuit 200 of FIG. 2. Circuit 300 further includes switch S1, which is controlled by voltage Vc. Switch S1 is coupled between nodes N2 and node N3. At the beginning of start-up, switch S1 is closed, so that current I3 is provided to the source of transistor M3. However, during normal operation, switch S1 is open, so that the voltage offset is removed.

Figure 4:
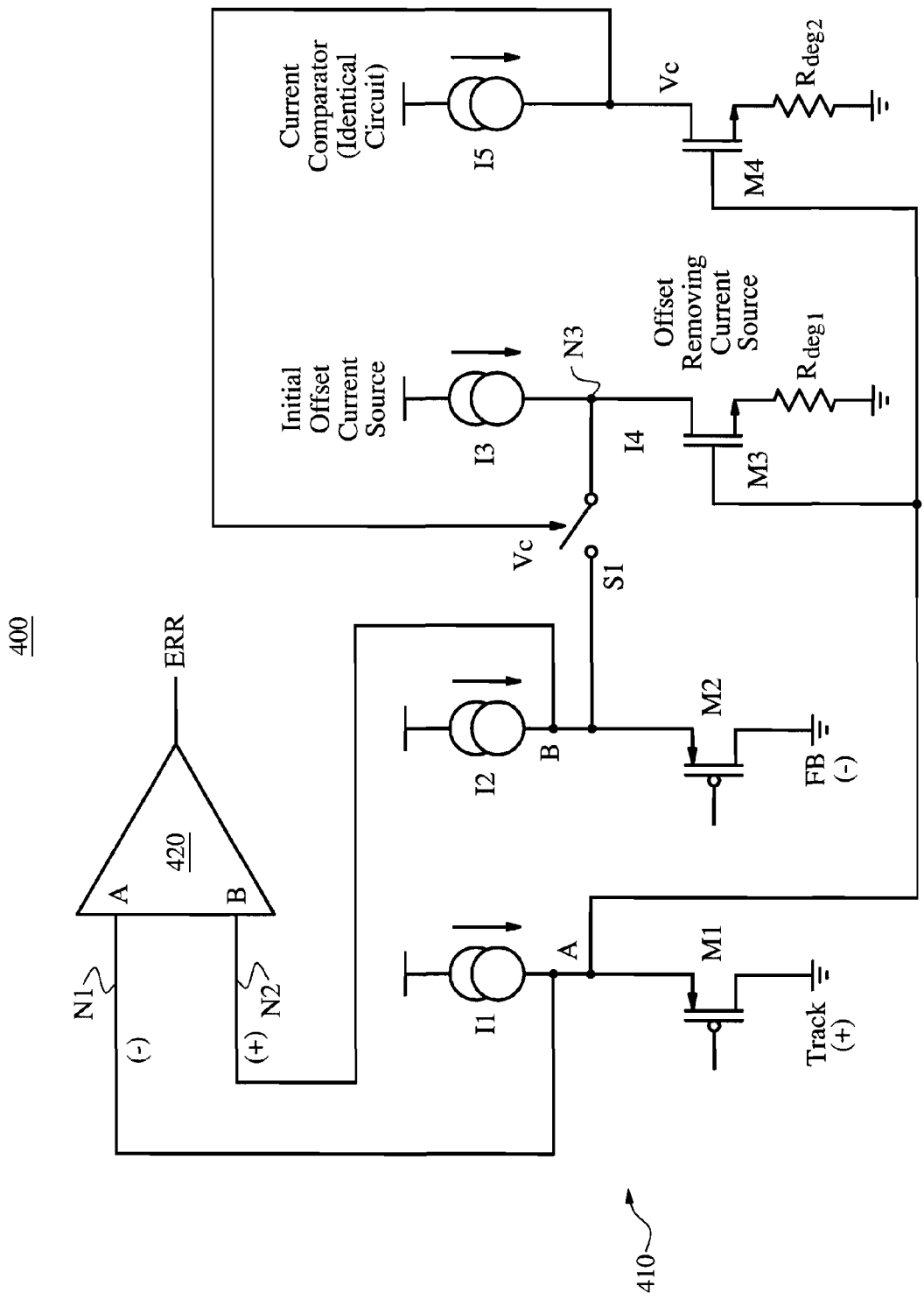
FIG. 4 illustrates a block diagram of yet another embodiment the error amplifier and voltage offset circuit of FIG. 1.

FIG. 4 illustrates a block diagram of circuit 400, which may be employed as an embodiment of circuit 300 of FIG. 3. Circuit 400 further includes current source I4-I5, transistor M4, and degeneration resistor Rdeg2. Current source I4 includes transistor M3 and degeneration resistor Rdeg1.

In operation, at start-up, signal Track is at zero volts, switch S1 is closed, and transistor M3 is off. Accordingly, the source of transistor M2 receives current I2+I3. As the voltage of signal Track gradually increases, current M3 eventually turns on. At this point, the source of transistor M2 receives a current of I2+I3-I4. As the voltage of signal Track continues to gradually increase, current I4 gradually increases, gradually canceling out more and more of current I3. Also, degeneration resistor Rdeg1 is included in one embodiment to ensure that this is accomplished linearly.

Current source I5, transistor M4, and resistor Rdeg2 operate together as a current comparator. At the beginning of start-up, the current comparator is untripped, and provides signal Vc at a logic high such that switch S1 is closed. When current I4 becomes equal to current I3, the current comparator trips, causing switch S1 to open. In this way, the switch opens when the current across it reaches substantially zero.

In one embodiment, M3, M4, Rdeg1, Rdeg2, I3, and I5 are laid out such that mismatch is minimized, to avoid a transient when Vc goes to zero. In one embodiment, resistors Rdeg1 and Rdeg2 are the same resistor, and the sources of transistors M3 and M4 are coupled together.

Although a particular embodiment of circuit 400 is illustrated in FIG. 4, more or less components may be included in various embodiments. For example, in one embodiment, hysteresis may be added to the current comparator.

Figure 5:
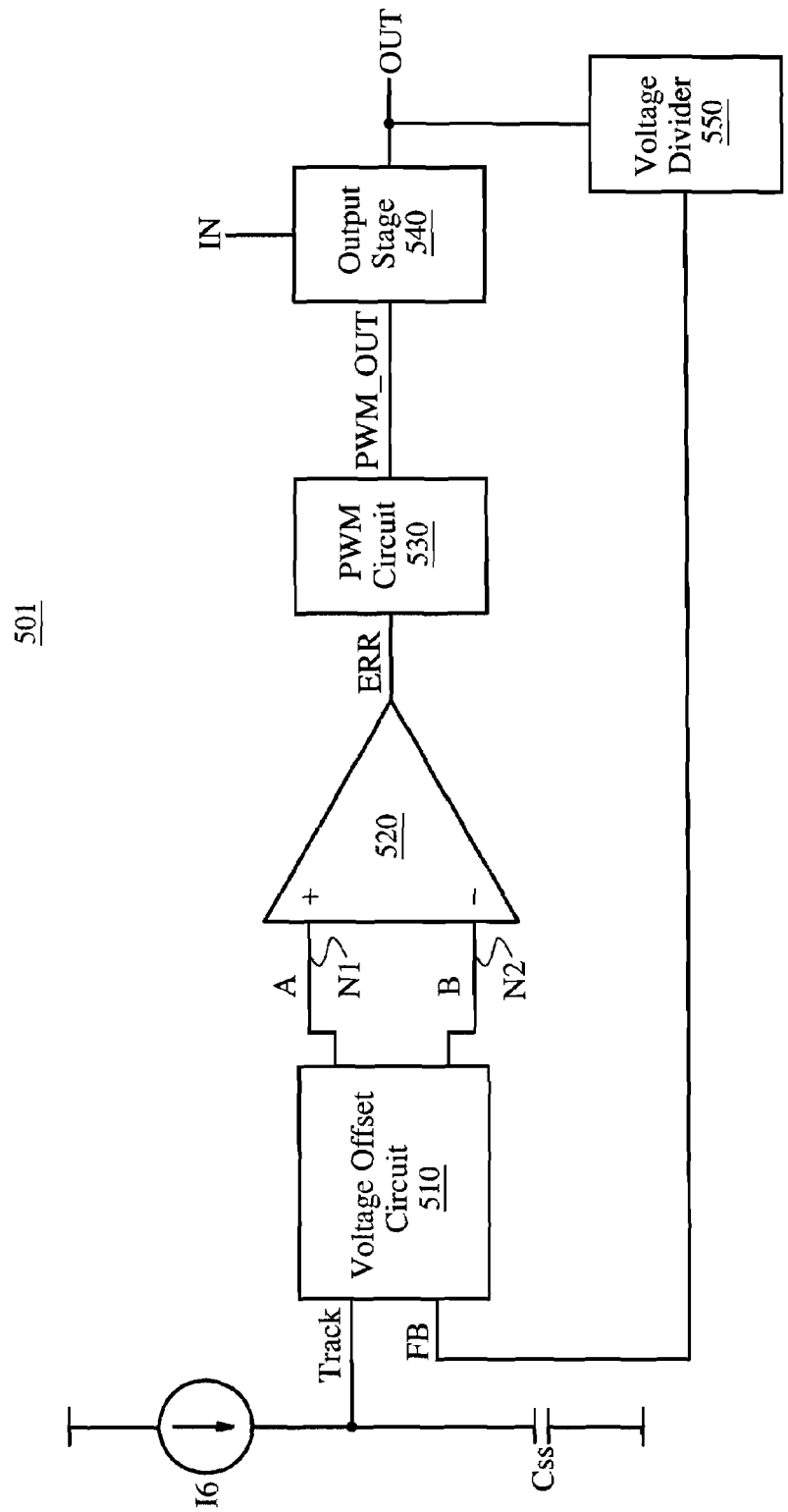
FIG. 5 shows a block diagram of an embodiment of a switching regulator that includes the error amplifier and voltage offset circuit of FIG. 1, in accordance with aspects of the present invention.

FIG. 5 shows a block diagram of an embodiment of regulator 501, which includes an embodiment of circuit 100 of FIG. 1. Regulator 501 may further include pulse width modulation (PWM) circuit 530, output stage 540, voltage divider 550, current source I6, and capacitor Css. Although a particular embodiment of regulator 501 is illustrated in FIG. 5, various embodiments may include more or less components. For example, although not shown in FIG. 5, regulator 501 may further include a compensation network coupled to error amplifier 520.

In one embodiment, PWM circuit 530 is operable to provide PWM output signal PWM_OUT by pulse width modulating error signal ERR. In one embodiments, PWM circuit 530 may be replaced with a pulse frequency modulation circuit, or the like.

Output stage 540 is operable to provide regulated output signal OUT based on input signal IN and signal PWM_OUT. In one embodiment, output stage 540 includes drivers, switches, and an output LC filter. Voltage divider 550 is operable to provide feedback signal FB from signal OUT.

Current source circuit I6 is operable to provide current I6 to soft-start capacitor Css to provide signal Track. In one embodiment signal Track is provided as a track pin that gives a user an option to provide either a capacitor or a voltage at the track pin.

If voltage offset circuit 510 were not included in switching regulator 501, it would be possible for output of error amplifier 520 to be initialized high, thus a transient at start-up. Because of the compensation network, error signal ERR would take some fixed amount of time to return to the normal operation range. The time it takes error signal ERR to recover would cause the regulator output signal OUT to overshoot above signal Track, causing a transient. However, regulator 501 may achieve a glitch-free start up by means of the voltage offset provided by voltage offset circuit 510.

Although a particular embodiment of regulator 501 is discussed above, other embodiments are within the scope and spirit of the invention. For example, in one embodiment, regulator 501 is a switching regulator, as discussed above. In other embodiments, regulator 501 may be a different type of regulator, such as a linear regulator, or the like. Virtually any circuit in which an error amplifier in closed loop operation is employed may be used as an embodiment of circuit 501.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A regulator controller, comprising:
   an error amplifier having at least an input, wherein the input includes a first input and a second input;
   a voltage offset circuit that is coupled to the input of the error amplifier, wherein the voltage offset circuit is arranged to provide a voltage offset to input of the error amplifier at a start-up, such that the voltage offset is absent during normal operation of the error amplifier; and
   one or more circuits that are arranged to couple the voltage offset circuit from the input of the error amplifier during a soft-start, and to de-couple the voltage offset circuit from the input of the amplifier after the soft-start.

2. The regulator controller of claim 1,
   wherein the voltage offset circuit is arranged to gradually reduce the voltage offset during a soft-start until the voltage offset reaches zero.

3. The regulator controller of claim 1, wherein the start-up includes an initial start-up and a re-start.

4. The regulator controller of claim 1, wherein:
   the one or more circuits are one or more switches that are arranged to couple the voltage offset circuit from the input of the error amplifier during a soft-start, and to de-couple the voltage offset circuit from the input of the amplifier after the soft-start.

5. The regulator controller of claim 1, further comprising:
   a track pin that is coupled to the first input of the error amplifier at least during a soft-start; and a current source having at least an output that is coupled to the track pin.

6. The regulator controller of claim 1, further comprising:
   a control circuit that is operable to control regulation of an output voltage based, in part, on the error signal, wherein a feedback signal is based, in part, on the output voltage, and wherein the feedback signal is coupled to the second input of the error amplifier.

7. The regulator controller of claim 1, wherein the voltage offset circuit is arranged such that the voltage offset is at least ten millivolts.

8. The regulator controller of claim 1, wherein the voltage offset circuit is arranged to provide the voltage offset such that the voltage offset is pre-determined such that, in a worst-case scenario based on manufacturing variations, the output of the error amplifier is low at start-up.

9. The regulator controller of claim 1, wherein
   the voltage offset circuit includes an offset current source that is arranged to provide an offset current to provide the voltage offset, wherein the voltage offset current is coupled to an offset current node.

10. The regulator controller of claim 9, wherein
    the voltage offset circuit further includes a switch that is coupled between the offset current node and the first input of the error amplifier, wherein the switch is arranged to be closed at the start-up, and open during the normal operation of the error amplifier.

11. The regulator controller of claim 9, wherein
    the voltage offset circuit further includes an offset-removing current course that is coupled to the offset current node, wherein the offset-removing current source is arranged to provide an offset-removing current if the a voltage at the second input of the error amplifier reaches a pre-determined voltage, and to provide the offset-removing current such that the offset-removing current increases as the voltage at the second input of the error amplifier increases above the pre-determined voltage.

12. The regulator controller of claim 11,
    wherein the offset-removing current source includes:
       a transistor having at least a gate, a drain, and a source, wherein the drain of the transistor is coupled to the offset current node, and wherein the gate of the transistor is coupled to the first input of the error amplifier; and
       a degeneration resistor that is coupled to the source of the transistor.

13. The regulator controller of claim 11, wherein
    the voltage offset circuit further includes a switch that is coupled between the offset current node and the first input of the error amplifier.

14. The regulator controller of claim 13, wherein
    the voltage offset circuit further includes a current comparator having at least an input that is coupled to the switch, wherein the current comparator has at least an output that is coupled to a control input of the switch; the current comparator is arranged to trip if the offset-removing current reaches the offset current; and wherein the switch is arranged to be closed if the current comparator is untripped, and to be open if the current comparator is tripped.

15. A regulator controller, comprising:
    an error amplifier having at least an input, wherein the input includes a first input and a second input; and
    a current mirror including a first current source and a second current source;
    a first transistor having at least a source that is coupled to the first current source;
    a second transistor having at least a source that is coupled to the second current source, wherein the source of the second transistor is coupled to the input of the error amplifier at least during a soft-start;
    a third current source that is arranged to provide current to the source of the second transistor during the soft-start.

16. The regulator controller of claim 15, further comprising a switch that is coupled between the third current source and the source of the second transistor, such that the switch is arranged to be open during normal operation of the error amplifier.

17. A method for voltage regulation, comprising:
    providing a voltage offset to an input of an error amplifier at a start-up by coupling a voltage offset to the error amplifier during the soft-start; and
    removing the voltage offset during of the error amplifier by de-coupling the voltage offset from the error amplifier after the soft-start.

18. The method of claim 17, wherein the start-up includes an initial start-up and a re-start.

19. The method of claim 17, wherein
    removing the voltage offset includes:
       abruptly removing the voltage offset after a soft-start.

20. The method of claim 17, wherein
    removing the voltage offset includes:
       gradually removing the voltage offset during a soft-start.

* * * * *